United States Patent [19]
Shieh et al.

[11] Patent Number: 5,621,225
[45] Date of Patent: Apr. 15, 1997

[54] LIGHT EMITTING DIODE DISPLAY PACKAGE

[75] Inventors: Chan-Long Shieh, Paradise Valley, Ariz.; Hsing-Chung Lee, Calabasas, Calif.; Paige M. Holm, Phoenix, Ariz.

[73] Assignee: Motorola, Schaumburg, Ill.

[21] Appl. No.: 599,434

[22] Filed: Jan. 18, 1996

[51] Int. Cl.⁶ .............................. H01L 27/15; H01L 23/48
[52] U.S. Cl. ................................. 257/81; 257/88; 257/99; 257/778; 257/779
[58] Field of Search ............................. 257/80, 81, 82, 257/88, 99, 737, 744, 745, 778, 786, 779

[56] References Cited

FOREIGN PATENT DOCUMENTS 3-184384  8/1991  Japan ............................ 257/99

Primary Examiner—Minh-Loan Tran
Attorney, Agent, or Firm—Eugene A. Parsons

[57] ABSTRACT

A light emitting diode display package and method of fabricating a light emitting diode (LED) display package including a light emitting diode array on a substrate, having row and column connection pads routed to display connection pads positioned on an uppermost surface of the LED array device, a separate silicon driver device having connection pads routed to an uppermost surface, positioned to cooperatively meet those of the LED device when properly registered, the LED device flip chip bump bonded to the driver device using standard C5 DCA, an underfill layer positioned between the space defined by the LED device and the driver device. The LED display and driver device package subsequently having selectively removed the substrate onto which the LED array was initially formed. The light emitted from the LED display device, being emitted through the remaining indium-gallium-aluminum-phosphide (InGaAlP) epilayer of the LED device.

17 Claims, 3 Drawing Sheets

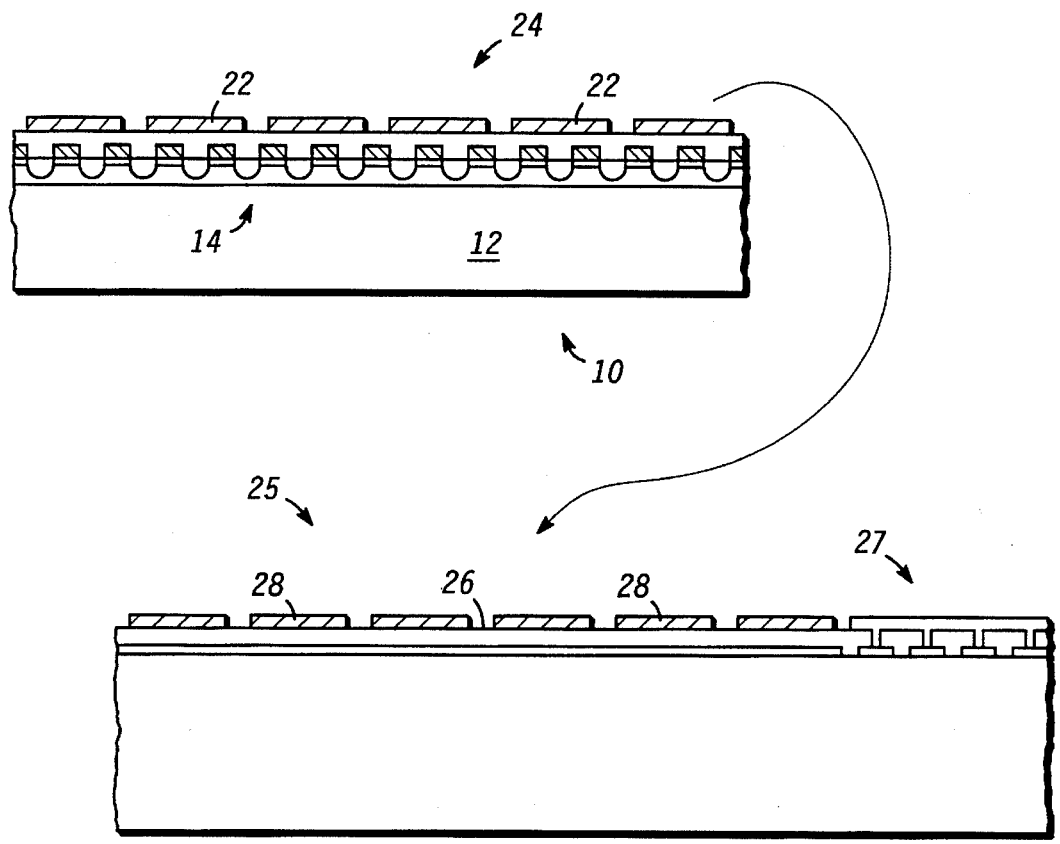
*FIG. 1*
*FIG. 2*
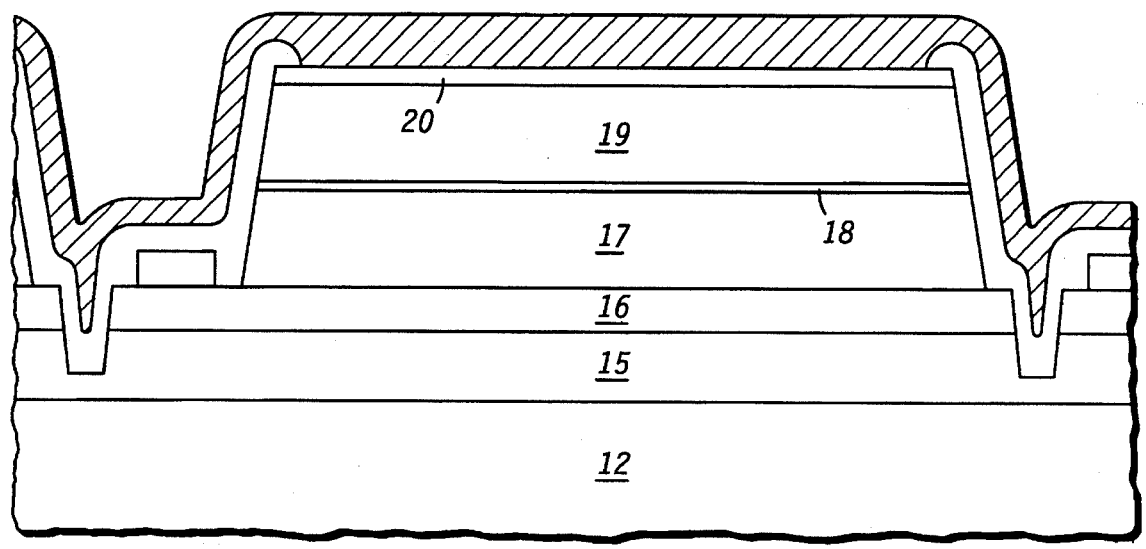

LIGHT EMITTING DIODE DISPLAY PACKAGE

FIELD OF THE INVENTION

The present invention pertains to light emitting diode arrays and more specifically to new and novel packaging and methods of packaging light emitting diode arrays together with drive electronics.

BACKGROUND OF THE INVENTION

Light emitting diodes (LEDs) are useful in various displays and especially in a new compact virtual display that utilizes a two-dimensional array of LEDs as an image source. Generally, these two dimensional arrays include large numbers of light emitting devices, from 5000 to 80,000 or more. A specific example exists where the image source consists of a high pixel count 2-dimensional array of LEDs, such as 240 columns by 144 rows, for a total of 34,560 pixels. An array the size of this specific example requires a total of 384 external interconnections to properly scan, or activate, and produce an image thereon. The array of LEDs is used to form complete images containing pictorial (graphic) and/or alphanumeric characters. The complete images are then magnified to produce virtual images which appear to an operator to be at least the size of a standard sheet of paper.

A major problem facing the productizing of such arrays is the penalty paid for this very large number of connection, or bond, pads required to provide information to the array. The foremost drawback is the increased semiconductor die area required for the connection pads and the interconnect fanout necessary to connect the connection pads to the rows and columns. A significant portion of the projected cost of the semiconductor chip on which the array is constructed is in the starting material and, with the 240×144 example set up for wire bonded external interconnects, the emitting region (light emitting diode array) occupies less than 20% of the total die area with the remaining 80% required for connection pads and interconnect fan out. Conventional direct chip attach (DCA) bonding will improve this ratio only slightly because of the larger pad sizes and interconnect pitches associated with the current state-of-the-art.

A large bonding substrate area is also required since a similar pad and interconnect fanout pattern must be repeated on accompanying semiconductor chips containing the drive electronics. Furthermore, the drive chips themselves must be large enough to accommodate the large number of connection pads (384 in this example). The net result is a large overall module which is not attractive for the applications of portable electronic devices where a premium is placed on small physical volumes.

One way to alleviate package size problems in LED display packaging is to simplify the package and assembly by integrating the LED display directly with the driver board, thereby minimizing the size requirement for both the LED device and the driver device. Traditionally, there is provided a plurality of driver and controller circuits mounted on a substrate, or in the alternative, mounted on an optically transparent substrate, having data input terminals and further having control signal output terminals interfaced with the leads of the light emitting devices for activating the light emitting devices to generate images in accordance with data signals applied to the data input terminals.

In inorganic LED configurations, generally a semiconductor substrate, or integrated circuit, is mounted on a printed circuit board or the like and the accepted method for connecting the substrate to external circuits is to use standard wire bond technology. However, when a semiconductor substrate having a relatively large array of electrical components or devices formed thereon is to be connected, standard wire bond techniques can become very difficult. For example, if a relatively large array (greater than, for example, 10,000 or 100×100) of light emitting diodes is formed on a substrate with a pitch (center-to-center separation) of P, then connection pads on the perimeter of the substrate will have a 2P pitch. This is true because every other row and every other column goes to an opposite edge of the perimeter to increase the distance between connection pads as much as possible.

At the present time wire bond interconnects from connection pads having a pitch of 4.8 mils is the best that is feasible. Thus, in the array mentioned above of 100×100 light emitting diodes the connection pads on the perimeter of the semiconductor chip would have a minimum pitch of 4.8 mils, with 50 connection pads situated along each edge of the perimeter. As more devices are included in the array, more connection pads are required and the perimeter size to accommodate the additional connection pads increases at an even greater rate. That is, since the minimum pitch of the bonding pads is 4.8 mils, the pitch of the devices in the array can be as large as 2.4 mils, or approximately 61 microns, without effecting the size of the substrate. Thus, even if the devices can be fabricated smaller than 61 microns, the minimum pitch of the bonding pads will not allow the perimeter of the substrate to be made any smaller. It can quickly be seen that the size of the substrate is severely limited by the limitations of the wire bonding technology.

Thus, there is a need for interconnect and packaging structures and techniques which can substantially reduce the limitations on size of LED display devices and semiconductor chips and which can reduce the amount of required surface area.

Accordingly, it is highly desirable to provide methods of fabricating LED arrays and interconnect apparatus packages which overcome these problems.

It is a purpose of the present invention to provide a new and improved method of fabricating LED arrays and interconnect apparatus packages.

It is a further purpose of the present invention to provide a new and improved LED array and integrated driver circuitry packaging for driving large arrays of LEDs.

It is another purpose of the present invention to provide new and improved integrated circuitry which requires less semiconductor chip area for larger arrays of devices.

It is another purpose of the present invention to provide a new and improved LED array and driver package with a substantially improved fill factor.

It is a still further purpose of the present invention to provide a new and improved method of fabricating LED arrays and driver packaging which is simpler and more efficient than prior methods which is easily adaptable to high production levels.

SUMMARY OF THE INVENTION

The above problems and others are substantially solved and the above purposes and others are realized in a method of fabricating a light emitting diode array and driver package, utilizing substrate removal. Disclosed in the present invention is a LED display package comprised of an integrated circuit including an addressable array of LED devices formed on a substrate, with all of the LED devices being connected in rows and columns. The LED device of the present invention further having connection pads formed directly on top of the LED display area, so as to minimize extra area needed for connection pads and wire bond interconnects. There is provided as a separate component a silicon (Si) driver device having connection pads formed on a major surface thereof.

The LED device is designed to have a plurality of row and column connection pads routed to a plurality of display connection, or bond, pads positioned on the display area of the LED device. There is provided a silicon (Si) driver die, designed to have connection or bond pads routed to an upper major surface so as to cooperatively match the connection pads of the LED device once mounted thereon. In addition, there are provided a plurality of connection or bond pads routed to the perimeter of the Si driver die for external connections. The LED device once formed is flip chip attached to the Si driver die utilizing conventional solder bump direct chip attach (DCA) bonding, well known in the art. The LED device is subsequently underfilled to increase the structural integrity of the overall package.

Next, the gallium arsenide (GaAs) substrate onto which the LED was initially formed is selectively removed by etching the whole assembly or selectively etching a release layer, leaving only an indium-gallium-aluminum-phosphide (InGaAlP) epilayer exposed. Light is emitted from the LED, in a direction opposite the mounting of the Si driver die. The emission of light in this direction occurs without the interference of the typical metal line interconnections, thereby improving the display performance by allowing higher luminance and larger pixel fill factors. In addition, there exists the potential for higher yield, lower cost packaging by eliminating the standard wire bond interconnects and size requirements presently known in the art.

Packaging the array together with its drive electronics, by interfacing the required large number of connection pads on the array to the same number of connection pads of the associated electronic circuitry, as disclosed in the present invention, produces a manufacturing process that is reliable and repeatable while maintaining small display and driver chips, overall compact package size, and cost effectiveness.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 1 is a simplified cross-sectional view illustrating a light emitting diode device and driver device in accordance with the present invention;

FIG. 2 is a simplified cross-sectional view illustrating a multi-layer embodiment of a light emitting diode device of the present invention;

DESCRIPTION OF THE PREFERRED EMBODIMENT

Figure 3:
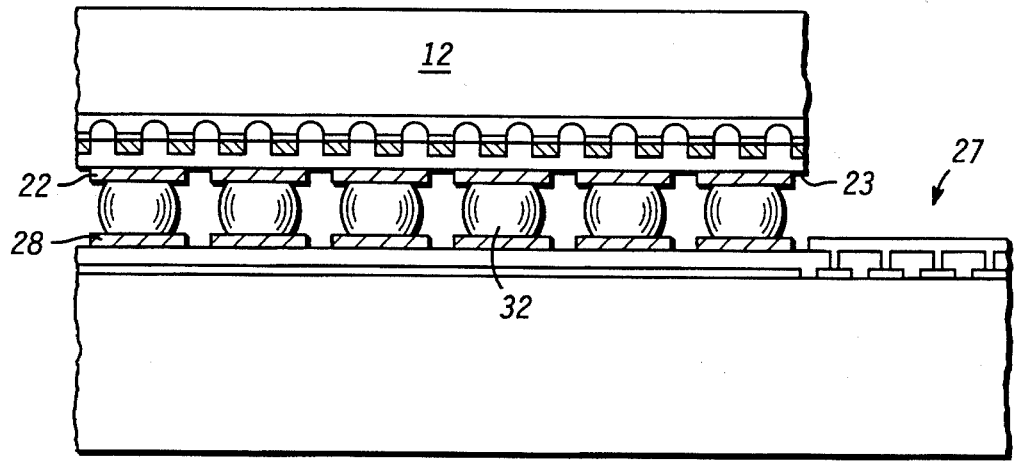
FIG. 3 is a simplified cross-sectional view illustrating the light/emitting diode device of the present invention flip chip attached to the Si driver device.

During the course of this description, like numbers are used to identify like elements and steps in the fabrication of the LED array and driver substrate package according to the different figures that illustrate the present invention.

Referring specifically to FIG. 1, a first structure in the fabrication process of a light emitting diode display package, comprised of a light emitting diode device, made up on an array of light emitting diodes, and a cooperating driver device, is illustrated in simplified sectional views. The light emitting diode device and the driver device are shown in FIG. 1 as separate components, prior to bump bond attachment. Illustrated is LED array device 10 which structurally includes a substrate 12 having a LED display array 14 formed thereon using any of the currently known methods for forming indium-gallium-aluminum-phosphide (InGaAlP) LED display arrays.

In a first specific example, and as illustrated in FIG. 2, one such method for forming the InGaAlP LED structure of the present invention includes substrate 12 having an upper surface on which is positioned, in the following order, an etch stop layer 15, a conductive layer 16, a first carrier confinement layer 17, an active layer 18, a second carrier confinement layer 19 and a conductive cap layer 20. It is understood that etch stop layer 15, conductive layer 16, and first carrier confinement layer 17 must be substantially transparent to allow for the passage of the light emitted from active layer 18 back through these layers once substrate 12 has been selectively removed. In this specific fabrication of LED display array 14, substrate 12 is formed of undoped gallium arsenide (GaAs) so that substrate 12 is a semiconductor. Etch stop layer 15, formed on the surface of substrate 12, is a transparent layer of non-conductive material, such as AlGaInP. Etch stop layer 15 is typically comprised of a different material than substrate 12, and has as its major purpose to facilitate the removal of substrate 12. In the alternative, etch stop layer 15 could be a release layer (not shown), formed of a material such as aluminum arsenide (AlAs), allowing for the release layer to be selectively etched away, thereby separating substrate 12 from the remaining LED epilayer structure. Conductive layer 16 is a transparent layer of GaAs or GaAlP epitaxially grown on the surface of etch stop layer 15 and is heavily doped ($10^{18}$ or greater) with a dopant such as selenium, silicon, etc. to make it a relatively good N+-type conductor. In this specific method of fabricating LED display array 14, conductive layer 16 is grown to a thickness of less than 500 angstroms so that it remains substantially transparent. First carrier confinement layer 17 is a layer of indium-gallium-aluminum-phosphide epitaxially grown on the surface of conductive layer 16 and doped ($10^{17}$–$10^{18}$) with silicon for N-type semiconductivity. Carrier confinement layer 17 is grown to a thickness in the range of approximately 1000–8000 angstroms. Active layer 18 is an undoped layer of indium-gallium-aluminum-phosphide epitaxially grown on the surface of carrier confinement layer 17 to a thickness in the range of approximately 100–1000 angstroms. Second carrier confinement layer 19 is a layer of indium-gallium-aluminum-phosphide epitaxially grown on the surface of active layer 18 and doped ($10^{16}$–$10^{18}$) with zinc for P-type semiconductivity. In this specific embodiment, carrier confinement layer 19 is grown to a thickness in the range of approximately 1000–8000 angstroms. Conductive cap layer 20 is epitaxially grown on the surface of carrier confinement layer 19 to a thickness in the range of approximately 200–1000 angstroms and is heavily doped ($10^{19}$) with zinc to make it a good P+-type conductor. The molecular fraction of aluminum, x, in $(Al_xGa_{1-x})0.5In_{0.5}P$ of carrier confinement layers 17 and 19 is in the range of approximately 0.7 to 1.0 and in active layer 18 is approximately 0.0 to 0.5. For simplicity of fabrication in the specific example disclosed, the layers are epitaxially grown as blanket layers over the entire substrate 12, but it will be understood that other methods, including masking and selective growth or selective etching, can be utilized to provide a plurality of areas necessary for the formation and definition of individual pixels.

It will of course be understood that the various layers can be provided in many other forms and the present embodiment of an InGaAlP LED structure is disclosed because of the simplicity of formation. Also, in some embodiments additional layers may be provided for various special applications and it should be understood that the disclosed structure is intended as an example of the basic structure of LED display array 14 for purposes of this disclosure and not as a limitation.

In this particular method of fabrication of LED display array 14, a first structure for LED array device 10 is disclosed in which cap layer 20 is selectively formed on carrier confinement layer 19 by any of several well known methods. For example, cap layer 20 is epitaxially grown as a blanket layer and a plurality of areas are removed by some convenient method such as etching to expose the surface of carrier confinement layer 19. The exposed areas of carrier confinement layer 19 define exposed row areas and exposed column areas so as to divide the remaining portions of cap layer 20 into a matrix of diode light emitting areas.

It will of course be understood that cap layer 20 could also be selectively grown or deposited by masking the surface of carrier confinement layer 19. In either method, cap layer 20 does not significantly alter the planarity of the process since it is only on the order of 500 angstroms thick. Additional information and further disclosure on this type of light emitting diode array and method of fabrication, as well as disclosed alternative embodiments, is available in U.S. Pat. No. 5,453,386, entitled "METHOD OF FABRICATION OF IMPLANTED LED", issued Sep. 26, 1995, assigned to the same assignee, and incorporated herein by this reference and its divisional application, now copending application, Ser. No. 08/513,259, entitled "IMPLANTED LED ARRAY AND METHOD OF FABRICATION", filed Aug. 10, 1995, assigned to the same assignee and incorporated herein by this reference.

In another copending application entitled "ELECTRO-OPTIC INTEGRATED CIRCUIT AND METHOD OF FABRICATION", filed May 9, 1994, Ser. No. 08/239,626, assigned to the same assignee, and incorporated herein by this reference, and its divisional application, now copending application, Ser. No. 08/513,655, entitled "ELECTRO-OPTIC INTEGRATED CIRCUIT AND METHOD OF FABRICATION", filed Aug. 10, 1995, assigned to the same assignee and incorporated herein by this reference, disclosed is a method of fabricating InGaAlP LED array structures utilizing mesa etched processing technology, as shown in FIG. 2. Specifically, disclosed is a structure in which portions of cap layer 20, first carrier confinement layer 17, active layer 18 and second carrier confinement layer 19, have been etched to form, or separate, mesas organized into a two dimensional array or matrix of rows and columns. The upper surface of each mesa in the array defines a light emitting area for a light emitting diode.

As stated, any additional methods now known for the fabrication of LED arrays in an InGaAlP LED structure, as well as those named above, can be utilized in the fabrication of the LED array device 10 of the present invention. Throughout this description references to rows and columns are made for simplicity of the disclosure but it will be understood by those skilled in the art, that these terms are completely interchangeable since rows and columns of a matrix or array generally depend upon a physical orientation.

Referring more specifically to FIG. 1, LED array device 10, formed according to any of the conventional methods for forming LED arrays known in the art, as well as those previously disclosed, is shown having a plurality of row and column connections (not shown) routed to a plurality of display connection pads 22 located directly on display area 24 utilizing a layer of routing metallization 33. The pads 22 are formed on display area 24 of LED display array 14 in row and column formation. A plurality of LED contact metallizations 35 are formed in the InGaAlP LED structure.

As illustrated, a silicon (Si) driver device 25 is provided which may contain all necessary array drivers, control electronics and memory needed to form a fully functional display module when the Si wafer is diced, schematically referred to in this disclosure as driver electronics 27. Driver device 25 has formed on an uppermost surface 26, a plurality of cooperating connection pads 28 to those pads 22 of LED array device 10. By positioning connection pads 22 and 28 in an essentially planar cooperative formation, directly on display area 24 and the uppermost surface 26 of driver device 25 respectively, the space required for the fan out of the conventional leads and in this instance, the actual connections is decreased, thereby making the fabrication of the device more economical. In addition, the contact metal of LED contact metallizations 35 can be formed from a reflective metal and used to reflect the emitted light into the viewing direction. This use of reflective metal will aid in eliminating lateral current spread and will allow the LED array device 10 to provide approximately double the power output due to the optical reflection. There may be provided in addition to connection pads 28 of driver device 25, a plurality of external interconnection pads (not shown).

In this specific example, display array 14 has a display with a 240×144 pixel resolution. Thus, the size of actual display area 24 is approximately 4.8 mm×2.88 mm. The number of connection pads 22 required for display array 14 is 384 (240+144=384). According to the present invention, connection pads 22 are formed in a 24×16 pad matrix. Likewise, connection pads 28 are similarly formed in a 24×16 pad matrix. The matrix of connection pads 22 and 28 are each formed into 24 columns, with a pitch of 200 μm (8 mils.), and 16 rows, with pitch of 220 μm (8 mils.) Thus, the actual area needed to make the interface between LED array device 10 and Si driver device 25 is approximately 4.8 mm×3.2 mm, which is only a slight increase in the area of actual display array 14.

During this initial step in the formation of the LED display and driver package of the present invention, additional steps to ensure the efficiency of the package can take place. Specifically, it is disclosed to fabricate a plurality of LED arrays 14 on a display wafer, using wafer probe techniques to screen out bad arrays. In addition, the array driver circuitry 27 can be fabricated on a silicon wafer and tested to screen out any bad chips, prior to the flip chip mounting of LED array device 10 to Si driver device 25.

Referring to FIG. 3, illustrated is a second step in the fabrication of the LED array and driver package of the present invention. Specifically, shown is LED array device 10 flip chip mounted to silicon (Si) driver device 25 using conventional solder bump direct chip attach (DCA) bonding well known in the art, thereby forming LED display and driver package 30 as illustrated. In addition, it is disclosed in the alternative to use wafer level processing technology to attach display chip 10 and driver chip 25. Additional information and further disclosure on this type of light emitting diode array and driver package and method of fabrication, as well as disclosed alternative embodiments, is available in copending U.S. patent application Ser. No. 08/588,470, entitled, "LED DISPLAY PACKAGING WITH SUBSTRATE REMOVAL AND METHOD OF FABRICATION", filed Jan. 18, 1996, assigned to the same assignee, and incorporated herein by this reference.

As previously stated, LED array device 10 is designed to have row and column connections routed to the plurality of connection pads 22 located an uppermost surface 23 of LED display device 10 (shown in FIG. 1), thereby positioned directly on display area 24 of LED array device 10. Si driver device 25 is designed to have cooperating connection pads 28 routed to an uppermost surface 26 of Si driver device 25, to electrically connect with those of LED array device 10.

LED device 10 is bump bonded to Si driver device 25 using conventional solder bump direct chip attach (DCA) bonding, well known in the art. In the assembly process, LED display device 10 is inverted so that uppermost surface 23 of LED array device 10, having connection pads 22 formed thereon, is placed in a downward position and connection pads 22 are positioned to each contact a separate connection pad 28, formed on Si driver device 25, when LED display device 10 and Si driver device 25 are properly registered.

Si driver device 25 has a plurality of bumps 32 (see FIGS. 4–5) of contacting material deposited on connection pads 28 for electrically and physically connecting LED array device 10 to Si driver device 25. Bumps 32 are formed of a material that is a relatively good electrical conductor and which can be at least partially melted and reset to form a good physical connection. Material which can be utilized for this purpose includes gold, copper, solder and especially high temperature solder, conducting epoxy, etc. Standard C5 DCA is utilized in the bump bonding of the LED display and driver package of the present invention. Some compatible metal may improve the assembly procedures, e.g., gold metallization or gold plating on mounting pads 28 of Si driver device 25.

Figure 4:
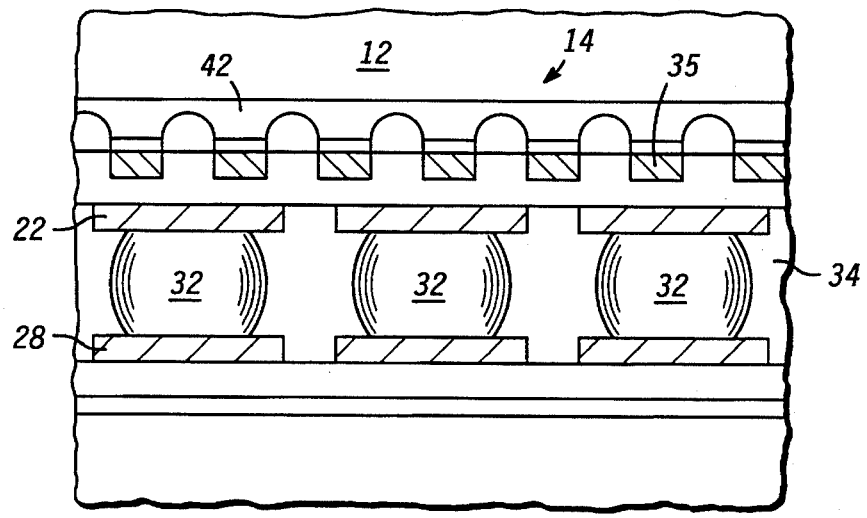
FIG. 4 is an enlarged and simplified, partial cross-sectional view illustrating a light emitting diode device bump bonded to the Si driver device of the present invention.

Referring to FIG. 4, illustrated is an enlarged and simplified, partial cross-sectional view, further showing LED array device 10 flip chip mounted to driver device 25 of the present invention. Subsequent to the bump bond attachment of LED array device 10 to Si driver device 25, a layer of underfill 34, composed of an epoxy or a polymer material is positioned, or deposited, within the area formed by bumps 32 of LED display and driver package 30. This positioning, or deposition, of underfill 34 makes for a more robust package design in that underfill 34 enhances the mechanical strength of the remaining LED thin film of LED array device 10 once removal of substrate 12 has taken place (discussed presently).

Figure 5:
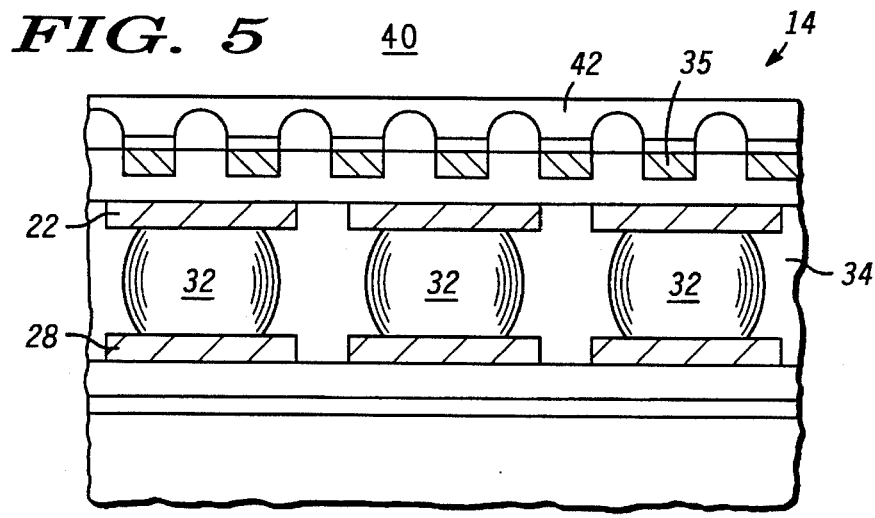
FIG. 5 is an enlarged and simplified, partial cross-sectional view illustrating final packaging of the light emitting display package in which the GaAs substrate of the light emitting diode device has been removed in accordance with the present invention.

Referring to FIG. 5, an enlarged and simplified, partial cross-sectional view of a complete light emitting diode display and driver device package 40 of the present invention is illustrated. As illustrated, the final step in the formation of LED display and driver device package 40 of the present invention is selectively removing substrate 12 of LED array device 10 using conventional etching techniques. Substrate 12, formed of undoped GaAs, is etched using wet etching techniques, or any alternative etching technique utilized in the art. In the alternative, as previously stated, an LED structure having formed therein a release layer, could be utilized, in which the release layer is selectively etched away, thereby separating substrate 12 from the remaining LED epilayer structure. Once the GaAs substrate is removed, an indium-gallium-aluminum-phosphide (InGaAlP) epilayer 42 is left remaining. The light emitted by the LED array device 10, is now emitted from the back surface of LED array device 10 which is now the front surface of LED display and driver package 40.

This removal of substrate 12 allows for the emission of light from what was initially the back of LED device 10, thus allowing uppermost surface 23 of display area 24 to be used as the connection or bond pad area. As previously stated, this formation of package 40 improves display performance by allowing higher luminance and large pixel fill factors due to the absence of light blocking metal line interconnects.

Figure 6:
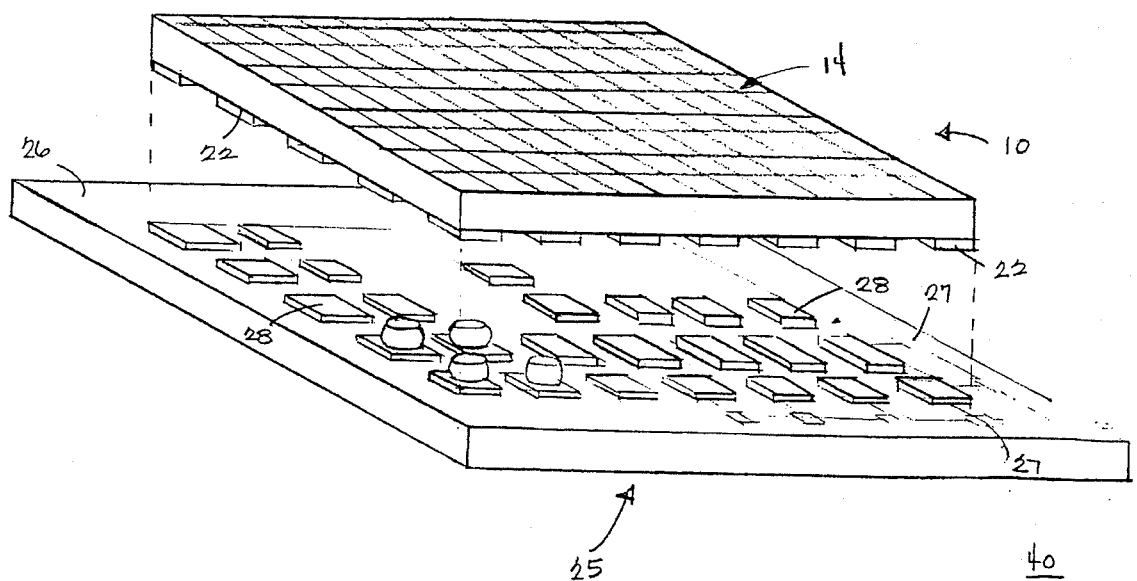
FIG. 6 is an exploded isometric view of the light emitting diode display package in accordance with the present invention.

Referring now to FIG. 6, illustrated in exploded isometric view is light emitting diode display and driver/package 40 in accordance with the present invention. More specifically, illustrated are bond pads 22 of LED device 12 positioned in a matrix of rows and columns, and bond pads 28 of driver device 25 also positioned in a mating matrix of rows and columns.

Thus, a new LED array device and driver package and method of fabricating an LED array together with its drive electronics which overcomes many of the prevalent problems is disclosed. The new and improved method of fabricating LED array and drive electronic packages is simpler and more efficient than other methods and is easily adaptable to high production levels. Further, the new and improved method of fabricating the package provides for packaging of the LED array device 10 and Si driver device 25 using conventional solder bump direct chip attach (DCA) bonding techniques.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A light emitting diode display package comprising:

a light emitting diode device having a defined display area, comprised of a two-dimensional array of light emitting diodes formed of a plurality of indium-gallium-aluminum-phosphide (InGaAlP) layers on an initially present substrate, the initially present substrate selectively removed, thereby exposing an epilayer defined by an outermost layer of the plurality of indium-gallium-aluminum-phosphide (InGaAlP) layers;

a plurality of bond pads, formed in electrical cooperation with the array of light emitting diodes;

a driver device formed on a silicon substrate and having a plurality of drive components monolithically integrated therein;

a plurality of bond pads, formed in electrical cooperation with the driver device; and a means for electrically connecting the bond pads, in electrical cooperation with the array of light emitting diodes, positioned on an uppermost surface of the display area of the light emitting diode device, to the bond pads formed in electrical cooperation with the driver device and routed to an uppermost surface of the driver device.

2. A light emitting diode display package as claimed in claim 1 wherein the array of light emitting diodes is formed on a major surface of the initially present substrate, the substrate being selectively removed subsequent to electrically connecting the light emitting diode device to the driver device.

3. A light emitting diode display package as claimed in claim 1 wherein the substrate is formed of gallium arsenide.

4. A light emitting diode display package as claimed in claim 1 wherein the plurality of indium-gallium-aluminum-phosphide (InGaAlP) layers include at least an etch stop layer of material supported on a major surface of the substrate, a conductive layer on the etch stop layer, a first carrier confinement layer on the conductive layer, an active layer on the first carrier confinement layer, and a second carrier confinement layer on the active layer.

5. A light emitting diode display package as claimed in claim 1 further including impurities residing in the plurality of indium-gallium-aluminum-phosphide (InGaAlP) layers thereby defining a plurality of isolated light emitting diodes positioned in a matrix of rows and columns and forming a plurality of vertical conductors through at least some of the plurality of indium-gallium-aluminum-phosphide (InGaAlP) layers to provide surface contacts to each diode in the array.

6. A light emitting diode display package as claimed in claim 1 wherein the plurality of bond pads in electrical cooperation with the array of light emitting diodes are positioned on an uppermost surface of the display area of the light emitting diode device and the plurality of bond pads in electrical cooperation with the driver device are routed to an uppermost surface of the driver device.

7. A light emitting diode display package as claimed in claim 6 wherein the array of light emitting diodes, further includes a plurality of LED contact metallizations, comprised of a reflective metal.

8. A light emitting diode display package as claimed in claim 6 wherein the means for electrically connecting the bond pads positioned on an uppermost surface of the display area of the light emitting diode device and the bond pads routed to an uppermost surface of the driver device includes flip chip attaching the light emitting diode device to the driver device with a plurality of solder bump bonds.

9. A light emitting diode display package as claimed in claim 8 wherein a layer of underfill is positioned in an area defined between the light emitting diode device and the driver device.

10. A light emitting diode display package as claimed in claim 9 wherein the layer of underfill is one of a polymer material and an epoxy material.

11. A light emitting diode display package comprising:

an array of light emitting diodes including a routing layer monolithically integrated with the array of light emitting diodes and having an initially present substrate, the initially present substrate selectively removed, forming a light emitting diode device having a defined display area;

a plurality of bond pads, formed in electrical cooperation with the array of light emitting diodes, positioned on an uppermost surface of the display area;

a driver device formed on a silicon substrate and having a plurality of drive components monolithically integrated therein;

a plurality of bond pads, formed in electrical cooperation with the driver device, routed to an uppermost surface of the driver device;

a plurality of bump bonds for electrically connecting the bond pads positioned on an uppermost surface of the display area of the light emitting diode device to the bond pads routed to an uppermost surface of the driver device; and a layer of underfill positioned in an area defined between the light emitting diode device and the driver device.

12. A light emitting diode display package as claimed in claim 11 wherein the array of light emitting diodes is formed on a major surface of the initially present substrate, the substrate being selectively removed subsequent to bump bonding of the light emitting diode device to the driver device.

13. A light emitting diode display package as claimed in claim 11 wherein the substrate is formed of gallium arsenide.

14. A light emitting diode display package as claimed in claim 11 wherein the array of light emitting diodes is comprised of an array of light emitting diode structures comprised of a plurality of layers of indium-gallium-aluminum-phosphide (InGaAlP).

15. A light emitting diode display package as claimed in claim 11 wherein the array of light emitting diodes further includes a plurality of LED contact metallizations, comprised of a reflective metal.

16. A light emitting diode display package as claimed in claim 11 wherein the layer of underfill is one of a polymer material and an epoxy material.

17. A light emitting diode display package comprising:

an array of light emitting diodes, forming a light emitting diode device having a defined display area, comprised of a two-dimensional array of light emitting diode structures formed of a plurality of indium-gallium-aluminum-phosphide (InGaAlP) layers on an initially present substrate, including at least one of an etch stop layer of material and a release layer supported on a major surface of the substrate, a conductive layer on the at least one of the etch stop layer and the release layer, a first carrier confinement layer on the conductive layer, an active layer on the first carrier confinement layer, and a second carrier confinement layer on the active layer, the initially present substrate selectively removed, thereby exposing an epilayer defined by the conductive layer of the plurality of indium-gallium-aluminum-phosphide (InGaAlP) layers;

a plurality of bond pads, formed in electrical cooperation with the array of light emitting diodes;

a driver device formed on a silicon substrate and having a plurality of drive components monolithically integrated therein;

a plurality of bond pads, formed in electrical cooperation with the driver device; and a means for electrically connecting the bond pads, in electrical cooperation with the array of light emitting diodes, positioned on an uppermost surface of the display area of the light emitting diode device, to the bond pads formed in electrical cooperation with the driver device and routed to an uppermost surface of the driver device.

* * * * *